United States Patent
Cho et al.

(10) Patent No.: US 8,482,641 B2
(45) Date of Patent: Jul. 9, 2013

(54) IMAGE SENSOR DEVICES HAVING PERIPHERAL CIRCUITS THEREIN THAT USE LIGHT GUIDE MATERIALS AS ELECTRICAL INSULATORS

(75) Inventors: Jung-Hyun Cho, Suwon-si (KR); June-Taeg Lee, Suwon-si (KR); Sun-Wook Heo, Seoul (KR); Kee-Moon Chun, Seongnam-si (KR)

(73) Assignee: Samsung Electronics Co., Ltd. (KR)

(*) Notice: Subject to any disclaimer, the term of this patent is extended or adjusted under 35 U.S.C. 154(b) by 257 days.

(21) Appl. No.: 12/964,043

(22) Filed: Dec. 9, 2010

(65) Prior Publication Data

US 2011/0176022 A1 Jul. 21, 2011

(30) Foreign Application Priority Data

Jan. 21, 2010 (KR) ........................ 10-2010-0005703

(51) Int. Cl.
*H04N 3/14* (2006.01)
*H04N 5/225* (2006.01)
*H01L 27/00* (2006.01)

(52) U.S. Cl.
USPC ..................... 348/294; 348/340; 250/208.1

(58) Field of Classification Search
USPC ................... 348/340, 294; 250/208.1
See application file for complete search history.

(56) References Cited

U.S. PATENT DOCUMENTS

| 2006/0183265 A1* | 8/2006 | Oh et al. .......................... 438/65 |
| 2009/0278967 A1* | 11/2009 | Toumiya ....................... 348/294 |
| 2010/0025571 A1* | 2/2010 | Toumiya et al. ........... 250/208.1 |

FOREIGN PATENT DOCUMENTS

| KR | 100720527 B1 | 5/2007 |
| KR | 100731128 B1 | 6/2007 |
| KR | 1020070087854 A | 8/2007 |
| KR | 100843967 B1 | 6/2008 |

* cited by examiner

*Primary Examiner* — Tuan Ho
*Assistant Examiner* — Shahbaz Nazrul
(74) *Attorney, Agent, or Firm* — Myers Bigel Sibley & Sajovec, P.A.

(57) ABSTRACT

An image sensor includes an array of image sensor cells, on a substrate, and a peripheral circuit region extending adjacent the array of image sensor cells. The array of image sensor cells includes a plurality of lens elements and a plurality of color filters extending adjacent the plurality of lens elements. A plurality of photodiodes is provided in the substrate. The plurality of photodiodes are aligned to corresponding ones of the plurality of lens elements. An interconnection structure is also provided, which extends between the plurality of photodiodes and the plurality of color filters. The interconnection structure has an array of cavities therein that are aligned to corresponding ones of the plurality of photodiodes and are filled with a light guide material. The peripheral circuit region includes a metal interconnect pattern and an electrically conductive pad on the metal interconnect pattern. An electrically insulating layer extends on the electrically conductive pad. The electrically insulating layer is formed of the light guide material.

20 Claims, 10 Drawing Sheets

IMAGE SENSOR DEVICES HAVING PERIPHERAL CIRCUITS THEREIN THAT USE LIGHT GUIDE MATERIALS AS ELECTRICAL INSULATORS

REFERENCE TO PRIORITY APPLICATION

This application claims priority to Korean Patent Application No. 10-2010-0005703, filed Jan. 21, 2010, the contents of which are hereby incorporated herein by reference.

FIELD

The present invention relates to image sensors and imaging devices including the image sensor.

BACKGROUND

An image sensor is a sensor that converts an optical image into an electric signal. Recently, with the development of computer industry and communications industry, there is an increasing demand for image sensors having improved performance in diverse fields including a digital camera, a camcorder, a PCS (Personal Communication System), a game machine, a guard camera, a micro camera for medical use, and the like.

In particular, a MOS image sensor has a simple drive system and adopts diverse scanning methods. Also, its signal processing circuit can be integrated into one chip to facilitate the miniaturization of the product, and the MOS processing technology can be compatibly used to lower the manufacturing cost of the sensor. Since the MOS image sensor has very low power consumption, it can be easily applied to a product having a limited battery capacity. Accordingly, with the development of the corresponding technology, the MOS image sensor has high resolution, and thus the use of the MOS image sensor has been abruptly increasing.

On the other hand, in order to embody such a high-resolution image sensor, technology that improves the sensitivity by spreading a high refractive light guide part on a photoelectric device has recently been used. However, in the case of an image sensor formed through such a manufacturing process, faults such as cracks or the like occur on the optical guide part spread on a conductive pad, and this causes problems in reliability of the image sensor.

SUMMARY

An image sensor according to an embodiment of the invention includes an array of image sensor cells, on a substrate, and a peripheral circuit region extending adjacent the array of image sensor cells. The array of image sensor cells includes a plurality of lens elements and a plurality of color filters extending adjacent the plurality of lens elements. A plurality of photodiodes is provided in the substrate. The plurality of photodiodes are aligned to corresponding ones of the plurality of lens elements. An interconnection structure is also provided, which extends between the plurality of photodiodes and the plurality of color filters. The interconnection structure has an array of cavities therein that are aligned to corresponding ones of the plurality of photodiodes and are filled with a light guide material. The cavities may also be lined with a moisture blocking layer. The peripheral circuit region includes a metal interconnect pattern and an electrically conductive pad on the metal interconnect pattern. An electrically insulating layer extends on the electrically conductive pad. The electrically insulating layer is formed of the light guide material. This electrically insulating layer may have an opening therein that extends opposite the conductive pad.

According to additional embodiments of the invention, the interconnection structure includes a plurality of inter-metal insulating layers having respective metal interconnnect structures therein. In addition, cavities extend through the plurality of inter-metal insulating layers. These cavities are filled with the light guide material, which has an index of refraction that is greater than an index of refraction of the inter-metal insulating layers. The index of refraction of the light guide material may be greater than or equal to 1.65. In particular, the light guide material includes a material selected from a group consisting of a fluor series polymer, a poly-siloxane resin, titanium oxide and a polymethyl methacrylate (PMMA) series polymer.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE EMBODIMENTS

Hereinafter, preferred embodiments of the present invention will be described in detail with reference to the accompanying drawings. The aspects and features of the present invention and methods for achieving the aspects and features will be apparent by referring to the embodiments to be described in detail with reference to the accompanying drawings. However, the present invention is not limited to the embodiments disclosed hereinafter, but can be implemented in diverse forms. The matters defined in the description, such as the detailed construction and elements, are nothing but specific details provided to assist those of ordinary skill in the art in a comprehensive understanding of the invention, and the present invention is only defined within the scope of the appended claims. In some embodiments of the present invention, well-known element structures and technologies are not described in detail since they would obscure the invention in unnecessary detail.

Although the terms "first, second, and so forth" are used to describe diverse elements, components and/or sections, such elements, components and/or sections are not limited by the terms. The terms are used only to discriminate an element, component, or section from other elements, components, or sections. Accordingly, in the following description, a first element, first component, or first section may be different from or may be identical to a second element, second component, or second section.

In the following description of the present invention, the terms used are for explaining embodiments of the present invention, but do not limit the scope of the present invention. In the description, a singular expression may include plural expressions unless specially described. The term "comprises" and/or "comprising" used in the description means that one or more other components, steps, operation and/or existence or addition of elements are not excluded in addition to the described components, steps, operation and/or elements.

Unless specially defined, all terms (including technical and scientific terms) used in the description could be used as meanings commonly understood by those ordinary skilled in the art to which the present invention belongs. In addition, terms that are generally used but are not defined in the dictionary are not interpreted ideally or excessively unless they have been clearly and specially defined.

Figure 1:
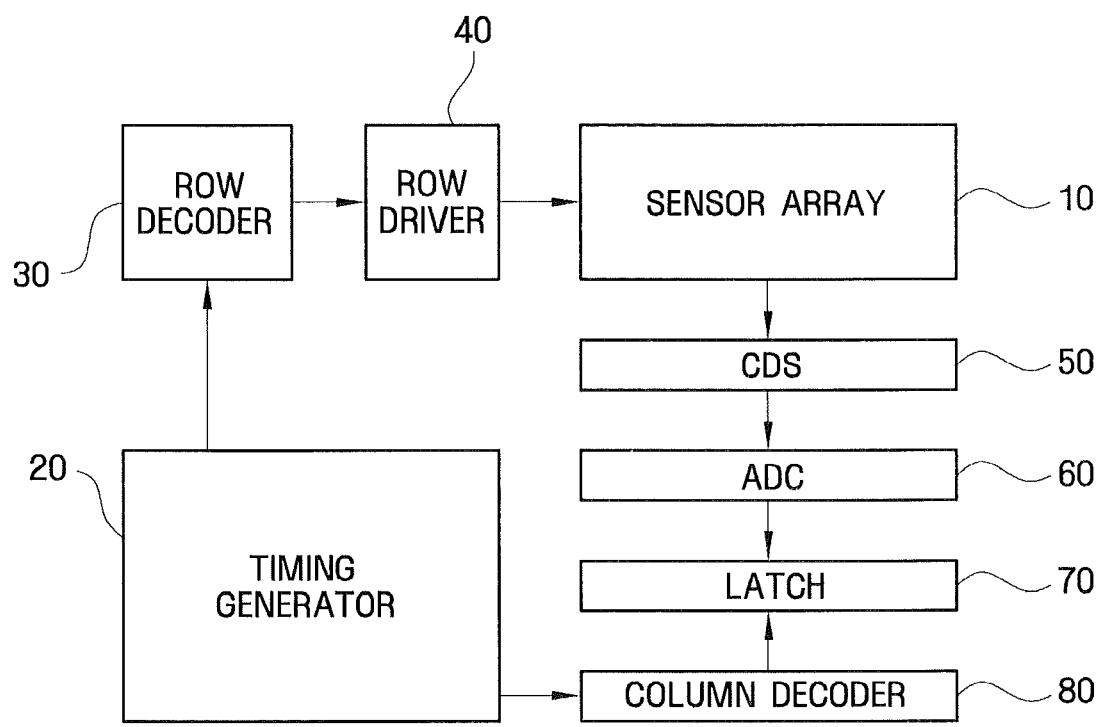
FIG. 1 is a block diagram of an image sensor according to embodiments of the present invention.
Figure 2:
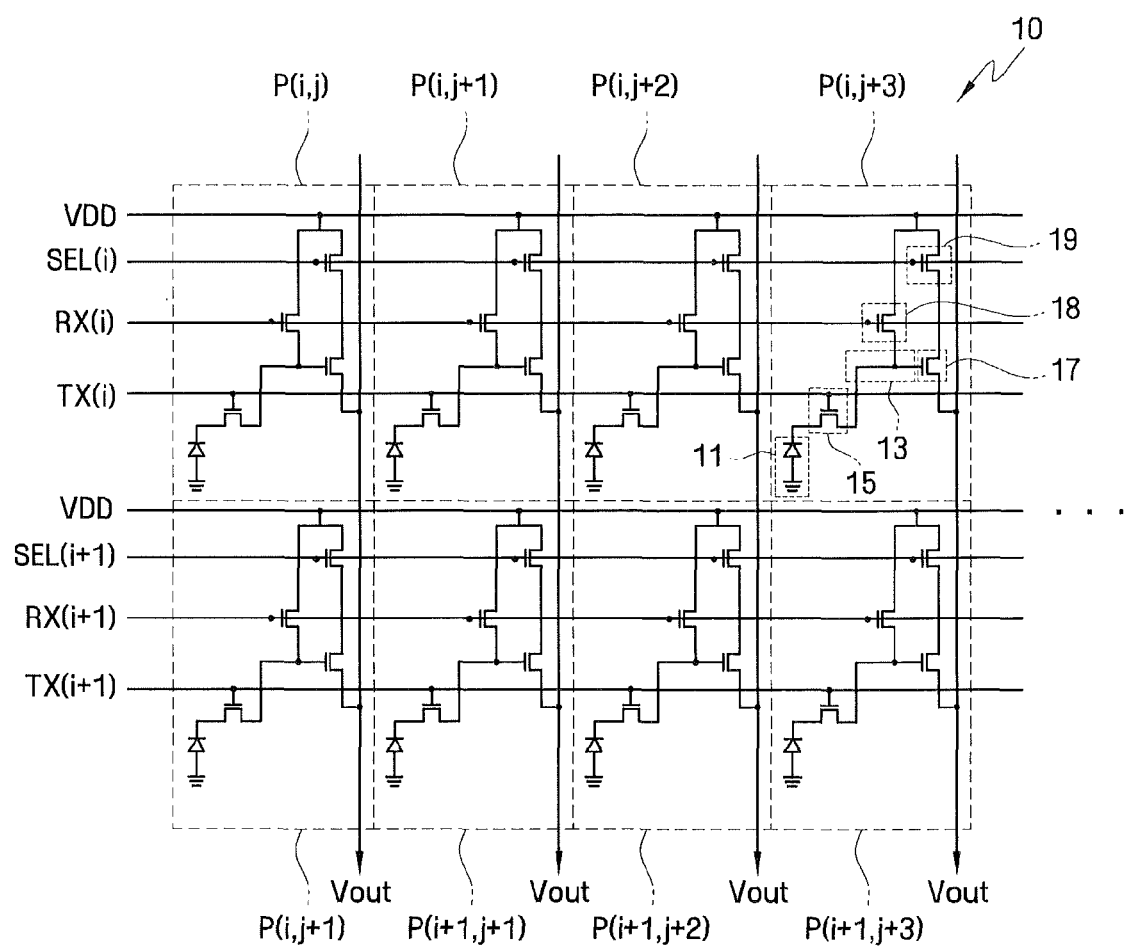
FIG. 2 is an equivalent circuit diagram of a sensor array of FIG. 1.

Hereinafter, with reference to FIGS. 1 and 2, an image sensor according to embodiments of the present invention will be described. FIG. 1 is a block diagram of an image sensor according to embodiments of the present invention, and FIG. 2 is an equivalent circuit diagram of a sensor array of FIG. 1. Referring to FIG. 1, an image sensor includes a sensor array 10 composed of pixels which include photoelectric conversion devices and are two-dimensionally arranged, a timing generator 20, a row decoder 30, a row driver 40, a correlated double sampler (CDS) 50, an analog-to-digital converter (ADC) 60, a latch 70, a column decoder 80, and the like. The sensor array 10 includes a plurality of unit pixels which are two-dimensionally arranged. The unit pixels serve to convert an optical image into an electrical output signal. The sensor array 10 receives a plurality of drive signals, such as a row selection signal, a reset signal, a charge transfer signal, and the like, from the row driver 40. Also, a converted electrical output signal is provided to the correlated double sampler 50 through a vertical signal line.

The timing generator 20 provides a timing signal and a control signal to the row decoder 30 and the column decoder 80. The row driver 40 provides a plurality of drive signals for driving the unit pixels to the active pixel sensor array 10 in accordance with the result of decoding in the row decoder 30. Generally, in the case where the unit pixels are arranged in the form of a matrix, the drive signals are provided for respective rows.

The correlated double sampler 50 receives an output signal formed in the active pixel sensor array 10 through vertical signal lines and performs holding and sampling of the output signal. That is, the correlated double sampler 50 performs double sampling of a specified noise level and the signal level of the output signal, and outputs a difference level that correspond to a difference between the noise level and the signal level.

The analog-to-digital converter 60 converts an analog signal that corresponds to the difference level into a digital signal and outputs the converted digital signal. The latch 70 latches the digital signal, and sequentially outputs the latched signal to an image signal processing unit (not illustrated) in accordance with the result of decoding in the column decoder 80.

Referring to FIG. 2, pixels P are arranged in the form of a matrix to constitute the sensor array 10. Each pixel P includes a photoelectric conversion device 11, a floating diffusion region 13, a charge transfer device 15, a drive device 17, a reset device 18, and a selection device 19. Functions of these devices will be described with reference to i-th row pixels P(i,j), P(i,j+1), P(i,j+2), P(i,j+3), ..., P(i,j+N), ..., P(i+N, j+N).

The photoelectric conversion device 11 absorbs an incident light, and accumulates charge that corresponds to the quantity of light. As the photoelectric conversion device 11, a photodiode, a phototransistor, a photo gate, a pinned photodiode, or a combination thereof may be adopted, and a photodiode has been exemplified in the drawing. The photoelectric conversion device 11 is coupled to the charge transfer device 15 that transfers the accumulated charge to the floating diffusion region 13. The floating diffusion region (FD) 13 is a region for converting the charge into a voltage, and since the floating diffusion region has a parasitic capacitance, charge is accumulatively stored therein. The drive device 17, which is exemplified as a source follower amplifier, amplifies the change of electric potential of the floating diffusion region 13 that receives the accumulated charge transferred from the photoelectric conversion device 11, and outputs the amplified change of electric potential through an output line Vout.

The reset device 18 periodically resets the floating diffusion region 13. The reset device 18 may be composed of a MOS transistor which is driven by a predetermined bias (i.e. reset signal) provided by a reset line RX(i) through which the bias is applied. If the reset device 18 is turned on by the bias provided by the reset line RX(i), a predetermined electric potential, e.g. a power supply voltage VDD, which is provided to a drain of the reset device 18, is transferred to the floating diffusion region 13. The selection device 19 serves to select pixels P to be read in the unit of a row. The selection device 19 may be composed of a MOS transistor that is driven by a bias (e.g. row selection signal) provided by a row selection line SEL(i). If the selection device 19 is turned on by the bias provided by the row selection line SEL(i), a predetermined electric potential, e.g. a power supply voltage VDD, which is provided to a drain of the selection device 19, is transferred to a drain region of the drive device 17. A transfer line TX(i) for applying a bias to the charge transfer device 15, the reset line RX(i) for applying the bias to the reset device 18, and the row selection line SEL(i) for applying the bias to the selection device may be arranged to extend substantially in parallel to one another in a row direction.

Figure 3:
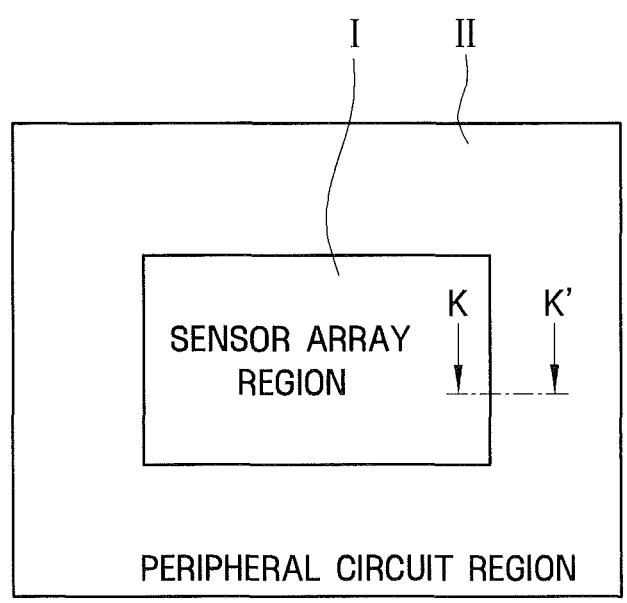
FIG. 3 is a conceptual view explaining an image sensor according to a first embodiment of the present invention.
Figure 4:
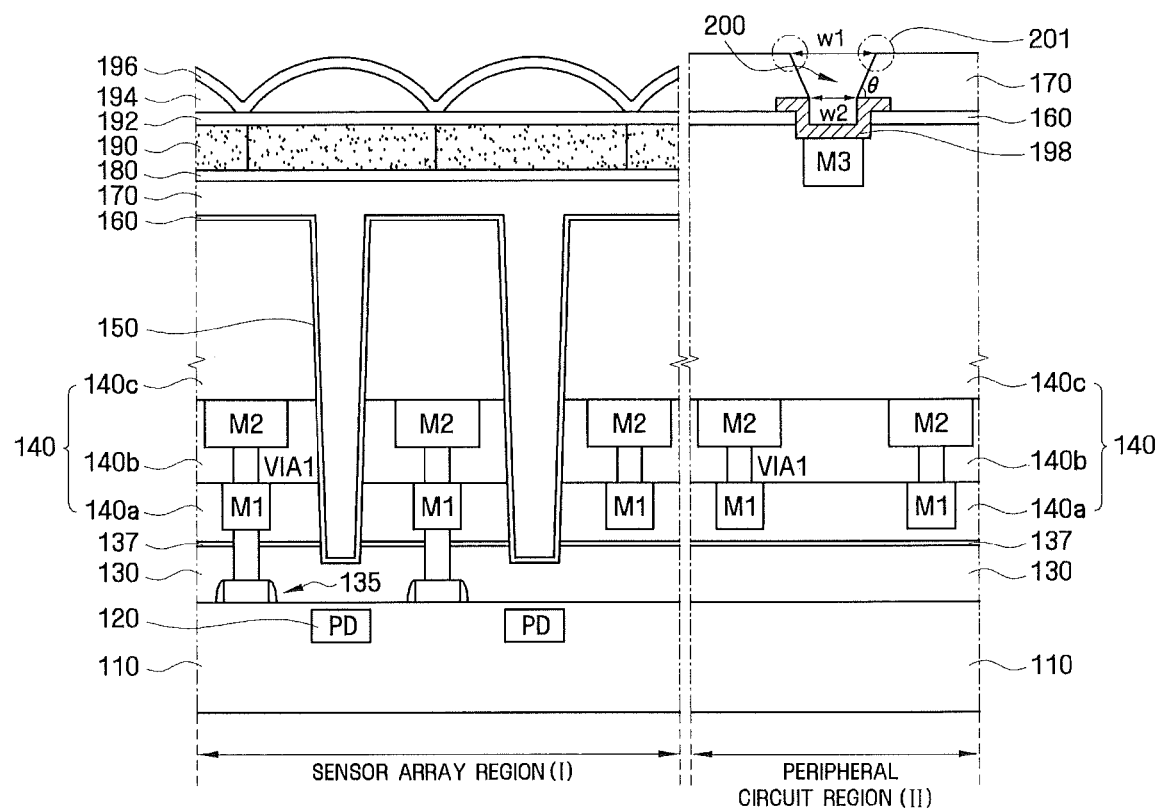
FIG. 4 is a sectional view of the image sensor according to the first embodiment of the present invention, taken along line K-K' of FIG. 3.
Figure 5:
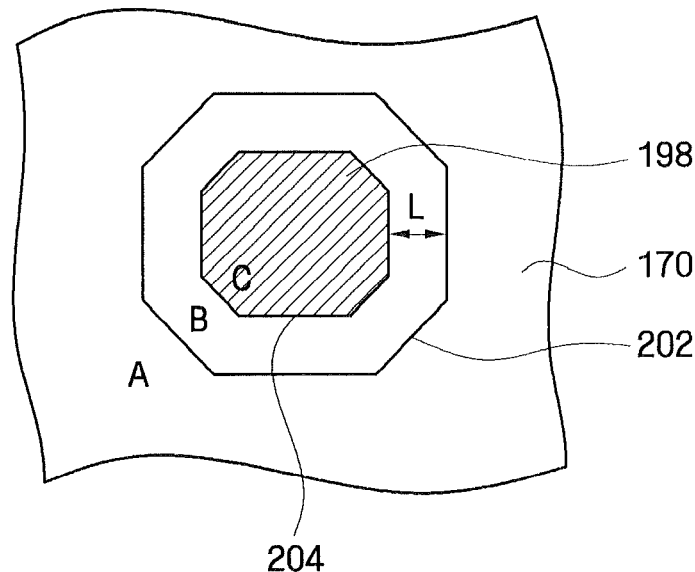
FIG. 5 is a plan view of a conductive pad portion of FIG. 4.
Figure 6:
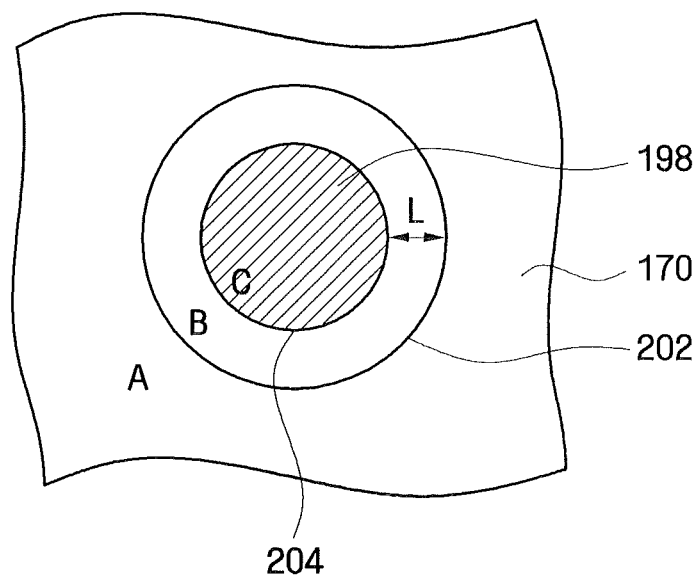
FIG. 6 is a plan view explaining an image sensor according to a modified embodiment of FIG. 5.

Hereinafter, with reference to FIGS. 3 to 6, an image sensor according to the first embodiment of the present invention will be described. FIG. 3 is a conceptual view explaining an image sensor according to a first embodiment of the present invention. FIG. 4 is a sectional view of the image sensor according to the first embodiment of the present invention, taken along line K-K' of FIG. 3, and FIG. 5 is a plan view of a conductive pad portion of FIG. 4. FIG. 6 is a plan view explaining an image sensor according to a modified embodiment of FIG. 5. For convenience in explanation, FIG. 4 illustrates only a part of a sensor array region and a part of a peripheral circuit region.

First, referring to FIG. 3, the peripheral circuit region II may be, for example, a region in which the correlated double sampler 50, the analog-to-digital converter 60, the latch 70, and the like are formed, and the sensor array region I may be a region in which the sensor array 10 of FIG. 1 is formed. Also, as illustrated, the peripheral circuit region II may be formed to surround the sensor array region I, but the scope of the present invention is not limited thereto. Referring to FIG. 4, an image sensor according to the first embodiment of the present invention may include a substrate 110, an interconnection structure 140, a cavity 150, an anti-moisture-absorption layer 160, a light guide part 170, and a conductive pad 198. The substrate 110 may be, for example, a first conduction type (e.g. p type) substrate. Although not illustrated, an epitaxial layer may be formed on the substrate 110, or a plurality of wells may be formed in the substrate 110. For example, the substrate 110 may be an SOI (Silicon On Insulator) substrate which includes a lower silicon substrate, a buried insulating layer formed on the lower silicon substrate, and a silicon semiconductor layer formed on the buried insulating layer. An isolation region (not illustrated) may be formed in the substrate 110, and an active region may be defined by the isolation region. In general, the isolation region may be FOX (Field OXide) or STI (Shallow Trench Isolation) using a LOCOS (Local Oxidation of Silicon) method. The isolation region serves to partition the unit pixels.

A photoelectric conversion device 120 may be formed in the substrate 110. The photoelectric conversion device 120 may absorb light of a color having passed through a color filter 190 and generate and/or accumulate charge corresponding to the quantity of light. The photoelectric conversion device 120 may adopt a phototransistor, a photo gate, a photodiode, a pinned photodiode, or a combination thereof, and in the embodiment of the present invention, a photodiode is adopted as the photoelectric conversion device 120. Although not illustrated in the drawing, a floating diffusion region for reading the charge accumulated in the photoelectric conversion device 120 may be formed in the substrate 110.

An interlayer insulating layer 130 may be formed on the substrate 110, and a plurality of gate structures 135 may be arranged in the interlayer insulating layer 130. The interlayer insulating layer 130 may include a silicon nitride layer and/or a silicon oxide layer. Also, the plurality of gate structures may be, for example, transistors. The transistor may include a charge transfer device, a selection device, a drive device, a reset device, and the like. For example, readout devices may be arranged on the sensor array region I, and MOS devices, resistors, capacitors, and the like, may be arranged in the peripheral circuit region II. Since it is well known to a person skilled in the art that the above-described devices can be embodied in diverse types, the explanation thereof will be omitted for convenience in explanation.

The interconnection structure 140 may be formed on the interlayer insulating layer 130. The interconnection structure 140 includes multilayer inter-metal insulating layers 140a, 140b, and 140c, and interlayer metal interconnections M1, M2, and M3 arranged in the multilayer inter-metal insulating layers 140a, 140b, and 140c, respectively. The interconnection structure 140 may include the first inter-metal insulating layer 140a, the first metal interconnection M1 formed in the first inter-metal insulating layer 140a, the second inter-metal insulating layer 140b formed on the first metal interconnection M1, the second metal interconnection M2 formed in the second inter-metal insulating layer 140b, the third inter-metal insulating layer 140c formed on the second metal interconnection M2, and the third metal interconnection M3 formed in the third inter-metal insulating layer 140c.

In this case, the multilayer metal interconnections M1, M2, and M3 may be, but are not limited to, copper interconnections or aluminum interconnections. For example, the multilayer metal interconnections M1, M2, and M3 may be damascene interconnections. The respective multilayer metal interconnections M1, M2, and M3 may be connected together by via contact VIA1.

The first inter-metal insulating layer 140a, the second inter-metal insulating layer 140b, and the third inter-metal insulating layer 140c may have a structure in which multilayer insulating layers are laminated, and for example, the first inter-metal insulating layer 140a may include silicon nitride layers and/or silicon oxide layers sequentially formed on the interlayer insulating layer 130.

Although not illustrated in the drawing, diffusion barrier layers may be formed among the multilayer inter-metal insulating layers 140a, 140b, and 140c. That is, diffusion barrier layers may be formed between the first inter-metal insulating layer 140a and the second inter-metal insulating layer 140b and between the second inter-metal insulating layer 140b and the third inter-metal insulating layer 140c, respectively. The diffusion barrier layers are to prevent metal atoms in the multilayer metal interconnections M1, M2, and M3 from being diffused. For example, if the multilayer metal interconnections M1, M2, and M3 are copper interconnections, the diffusion barrier layers can prevent the diffusion of the copper atoms.

Also, the diffusion barrier layers can serve as etch stop layers when the metal interconnections are formed. Accordingly, the diffusion barrier layers and the multilayer inter-metal insulating layers 140a, 140b, and 140c may have different etch rates. For example, the multilayer inter-metal insulating layers 140a, 140b, and 140c may be silicon oxide layer, and the diffusion barrier layers may be silicon nitride layers. A cavity 140c to be described later may be formed to pierce the multilayer inter-metal insulating layers 140a, 140b, and 140c including the diffusion barrier layers.

For example, an etch stop layer 137 may be formed between the interconnection structure 140 and the interlayer insulating layer 130. That is, the etch stop layer 137 may be formed on the interlayer insulating layer 130, and the interconnection structure140 may be formed on the etch stop layer 137. For example, the etch stop layer 137 may include a silicon nitride layer or a silicon oxide layer. The etch stop layer 137 may be used to adjust the depth of the cavity 150 to be described later.

The cavity 150 extends through the interconnection structure 140 corresponding to the photoelectric conversion device 120. More specifically, since interfaces exist between the multilayer inter-metal insulating layers 140a, 140b, and 140c, which are formed of a plurality of layers, and the interlayer insulating layer 130, such interfaces may obstruct an incident light provided through a color filter 190 from reaching the photoelectric conversion device 120. Also, since the diffusion barrier layer (e.g. the silicon nitride layer), has a low light transmittance, it may obstruct the incident light from reaching the photoelectric conversion device 120. Accordingly, the cavity 150, which is formed on the photoelectric conversion device 120 and extends through the interconnection structure 140, can increase the light quantity and the light sensitivity of the incident light that reaches the photoelectric conversion device 120.

As illustrated in FIG. 4, the cavity 150 may be formed to extend through the etch stop layer 137 and the interlayer insulating layer 130. Also, the cavity 150 may have a tapered side profile, and an upper width of the cavity 150 may be formed to be larger than a lower width thereof. Also, a bottom surface of the cavity 150 may be evenly formed. However, this is merely one embodiment, and the feature of the cavity is not limited thereto. For example, the cavity 150 may not have a tapered side profile, and the bottom surface of the cavity 150 may be concave or convex shape rather than a planar shape.

The anti-moisture-absorption layer 160 may be conformally formed on the cavity 150 that is formed in the interconnection structure 140. For example, the anti-moisture-absorption layer 160 may be formed on the whole surface of the substrate 110 including the side wall and the button surface of the cavity 150 in a sensor array (see "10" in FIG. 1), except for a region, i.e. a region of a conductive pad 198 of a peripheral circuit region II. In other words, the anti-moisture-absorption layer 160 may be conformally formed on both side surfaces and the bottom surface of the cavity 150 and may be formed to extend to the upper surface of the inter-metal insulating layer 140c.

On the other hand, as illustrated in FIG. 4, the conductive pad 198 may be formed on the anti-moisture-absorption layer 160 of the peripheral circuit region II. One part of the conductive pad 198, as illustrated in FIG. 4, may be formed in the third inter-metal insulating layer 140c to connect with the third metal interconnection M3, and the other part of the conductive pad 198 may be formed on the anti-moisture-absorption layer 160 that is formed on the interconnection structure 140.

The light guide part 170 may include a light transmission material which is formed on the anti-moisture-absorption layer 160 and fills the cavity 150. That is, the cavity 150 may be filled with the light transmission material, and the light transmission material may be formed on the anti-moisture-absorption layer 160. As illustrated in FIG. 4, the light transmission material of the light guide part 170 fills the cavity 150, and is formed to extend to the upper surface of the inter-metal insulating layer 140c on the uppermost part of the interconnection structure 140. Accordingly, the anti-moisture-absorption layer 160 is conformally formed on both side walls and the bottom surface of the cavity 150 and the uppermost surface of the interconnection structure 140, and the light transmission material is formed on the anti-moisture-absorption layer 160 to fill the cavity 150.

On the other hand, as illustrated in FIG. 4, the light guide part 170 may also be formed on the conductive pad 198 and the anti-moisture-absorption layer 160 of the peripheral circuit region II. In this case, the light guide plate 170 formed on the peripheral circuit region II may include an opening 200 having a tapered side profile which is formed on the conductive pad 198 as illustrated in FIG. 4. The upper width W1 of the opening 200 may be larger than the lower width W2 thereof. That is, the opening 200 may have a trapezoid-shaped side profile of which the upper width W1 is larger than the lower width W2 thereof. In this case, the taper angle θ of the opening 200 may be 50° to 70°. The opening 200 having the tapered side profile as described above may be formed by performing photolithography with respect to the light guide part 170 using photoresist (not illustrated) having a tapered side profile.

Referring to FIG. 5 overlooking the conductive pad 198 and the light guide part 170, the light guide part 170 may include a planarization region A, a slope region B, and an exposure region C for exposing the conductive pad 198. An area formed by a first boundary 202 that is defined as a boundary between the planarization region A and the slope region B may be larger than an area formed by a second boundary 204 that is defined as a boundary between the slope region B and the exposure region C. Also, the first boundary 202 may have the same shape as that of the second boundary 204. Specifically, the shape of the first boundary 202 and the second boundary 204 may be an octagon. Also, the width L of the slope region B may be 1 to 5 μm.

Although the first boundary 202 and the second boundary 204 are in the shape of an octagon in FIG. 5, they may be formed to have different shapes by a defocusing exposure process. That is, the first boundary 202 and the second boundary 204 may be formed in the shape of a curve rather than in the shape of a straight line as shown in FIG. 5.

On the other hand, the area formed by the first boundary 202 may be an area of an upper surface of the opening 200, and the area formed by the second boundary 204 may be an area of a lower surface of the opening 200. Accordingly, the area of the upper surface of the opening 200 may be larger than the area of the lower surface thereof. Also, the shape of the upper surface of the opening 200 may be in the shape of an octagon as shown in FIG. 5.

As illustrated in FIG. 6, the first boundary 202 and the second boundary 204 of an image sensor according to a modified embodiment of the first embodiment of the present invention may be in the shape of either a circle or an ellipse. Also, in the same manner, the width L of the slope region B may be 1 to 5 μm. Here, the area formed by the first boundary 202 may be an area of the upper surface of the opening 200, and the area formed by the second boundary 204 may be an area of the lower surface of the opening 200. Accordingly, the area of the upper surface of the opening 200 may be larger than the area of the lower surface thereof. Also, the upper surface of the opening 200 may be in the shape of either a circle or an ellipse as shown in FIG. 6.

If the opening 200 of the light guide part 170 is formed to have the same shape as that of the opening 200 of the image sensor according to the first embodiment of the present invention, faults such as cracks or the like, which are formed on an edge portion 201 of the light guide part 170 in the process of etching the light guide part 170 in order to expose the conductive pad 198, can be reduced, and thus the reliability of the image sensor can be improved.

Although it is exemplified in FIG. 4 that the anti-moisture-absorption layer 160 is conformally formed on the uppermost surface of the interconnection structure 140 of the sensor array region I and the light transmission material is formed on the anti-moisture-absorption layer 160 to fill the cavity 150, the anti-moisture-absorption layer 160 formed on the uppermost surface of the interconnection structure 140 of the sensor array region I may be omitted as needed.

The light guide part 170 serves to make the light incident into the cavity 150 through the color filter 190 stably reach the photoelectric conversion device 120. Accordingly, the light transmission material, in order to make the incident light well transmitted therethrough, may be made of, for example, an organic polymer compound, for example, a fluoro series polymer Cytop™ having a ring structure, poly-siloxane resin, poly-siloxane resin and titanium oxide, or PMMA series polymer.

Also, light transmission material of the light guide part 170 may be a material having a refractive index which is higher than that of a material that forms the multilayer inter-metal insulating layers 140a, 140b, and 140c. For example, the refractive index of the light transmission material of the light guide part 170 may be similar to the refractive index of the anti-moisture-absorption layer 160. Accordingly, the light incident to the light guide plate 170 is totally reflected inside the cavity 150, and due to this, the incident light can stably reach the photoelectric conversion device 120. For example, the light transmission material of the light guide part 170 may have the refractive index that is equal to or higher than about 1.65.

Referring to FIG. 4, on the light guide part 170, a lower planarization layer 180, a color filter 190, an upper planarization layer 192, a lens 194, and a protection layer 196 may be sequentially formed. In FIG. 4, it is exemplified that the planarization layers 180 and 192 are formed on both upper and lower sides of the color filter 190. However, the forming of the planarization layer is not limited thereto. The planarization layer 192 may be formed only on the upper side of the color filter 180, or may be formed on neither the upper side nor the lower side of the color filter 190.

The lens 194 may be formed of an organic material such as photosensitive resin or an inorganic material. In the case of forming the lens 194 with an organic material, for example, the lens 194 may be formed by forming an organic material pattern on the upper planarization layer 192 and performing a thermal process thereon. Through the thermal process, the organic material pattern is changed to a lens shape.

The protection layer 196 may be an inorganic oxide layer. For example, a silicon oxide layer, a titanium oxide layer, a zirconium oxide ($ZrO_2$) layer, a hafnium oxide ($HfO_2$) layer and its laminated layer, or a combined layer may be used. In particular, as the protection layer 196, LTO (Low Temperature Oxide), which is a kind of a silicon oxide layer, may be used. The reason why such LTO is used is that the LTO is manufactured at low temperature (at about 100 to 200° C.), and thus lower layers are less damaged. In addition, since LTO is amorphous, it is not rough, and thus the reflection, refraction, scattering, or the like, of the incident light can be reduced.

In the case where the lens 194 is made of an organic material, it may be weak against an external impact. Accordingly, the protection layer 196 serves to protect the lens 194 from an external impact. Also, some space may exist between the lenses 194, and the protection layer 196 also serves to fill such space. If the space between the neighboring lenses 194 is filled, the converging capability of the incident light can be heightened. This is because the reflection, refraction, scattering, or the like, of the incident light that reaches the space between the neighboring lenses 194 can be reduced.

Further, an adhesion layer (not illustrated) may be formed on the light transmission material of the light guide part 170. The adhesion layer strengthens the adhesion capability between the light transmission material of the light guide part 170 on the lower side and the color filter 190 on the upper side, and thus the light transmission material and the color filter 190 can be adhered more stably.

Figure 7:
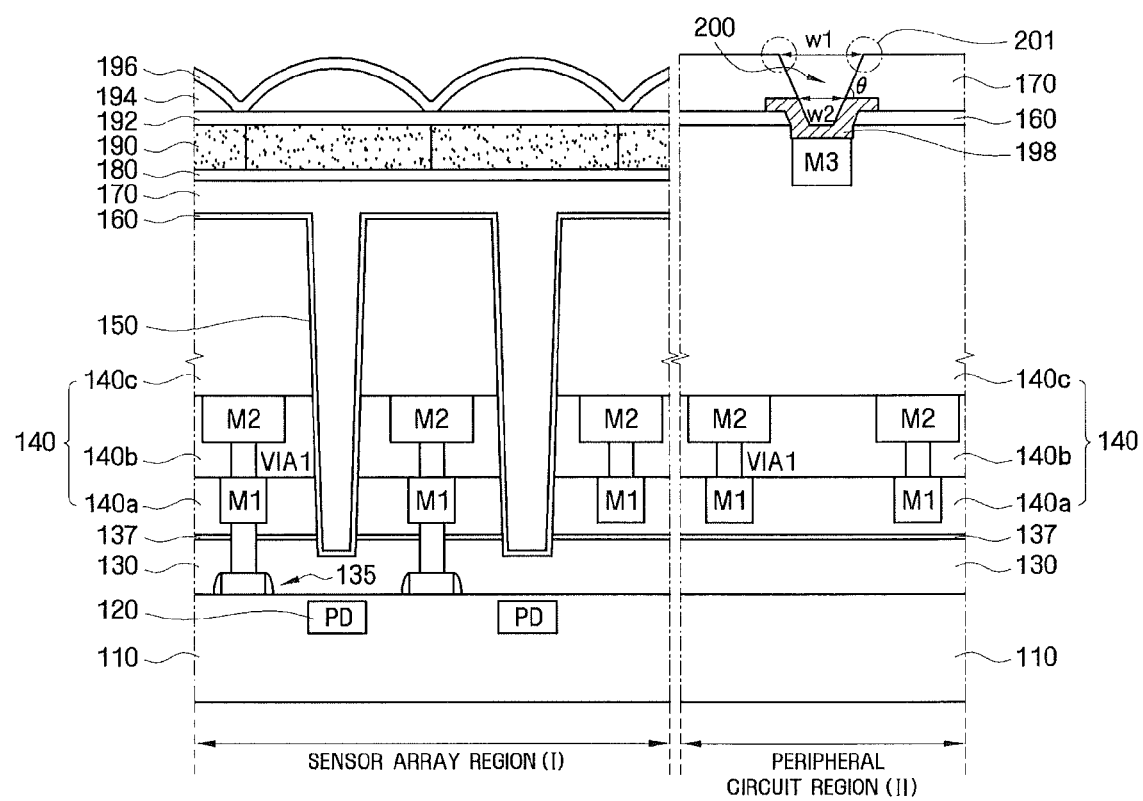
FIG. 7 is a sectional view of the image sensor according to a second embodiment of the present invention, taken along line K-K' of FIG. 3.

Next, with reference to FIG. 7, an image sensor according to a second embodiment of the present invention will be described. FIG. 7 is a sectional view of the image sensor according to a second embodiment of the present invention, taken along line K-K' of FIG. 3. The image sensor according to the second embodiment of the present invention is the same as the image sensor according to the first embodiment of the present invention except for a portion of a conductive pad 198, and thus the duplicate explanation thereof will be omitted.

Referring to FIG. 7, a conductive pad 198 of an image sensor according to the second embodiment of the present invention may have a tapered side profile. More specifically, an anti-moisture-absorption layer 160 may be conformally formed on the uppermost surface of an interconnection structure 140 of a peripheral circuit region II to have a tapered side profile, and a conductive pad 198 is conformally deposited on the anti-moisture-absorption layer 160 to have a tapered side profile. In this case, the taper angle of the anti-moisture-absorption layer 160 and the conductive pad 198 may be smaller than 80° in the same manner as the taper angle θ of the opening 200. Specifically, the taper angle of the anti-moisture-absorption layer 160 and the conductive pad 198 may be 50° to 70°. Since other particulars of the image sensor according to the second embodiment of the present invention are the same as those of the image sensor according to the first embodiment of the present invention, the duplicate explanation thereof will be omitted.

Figure 8:
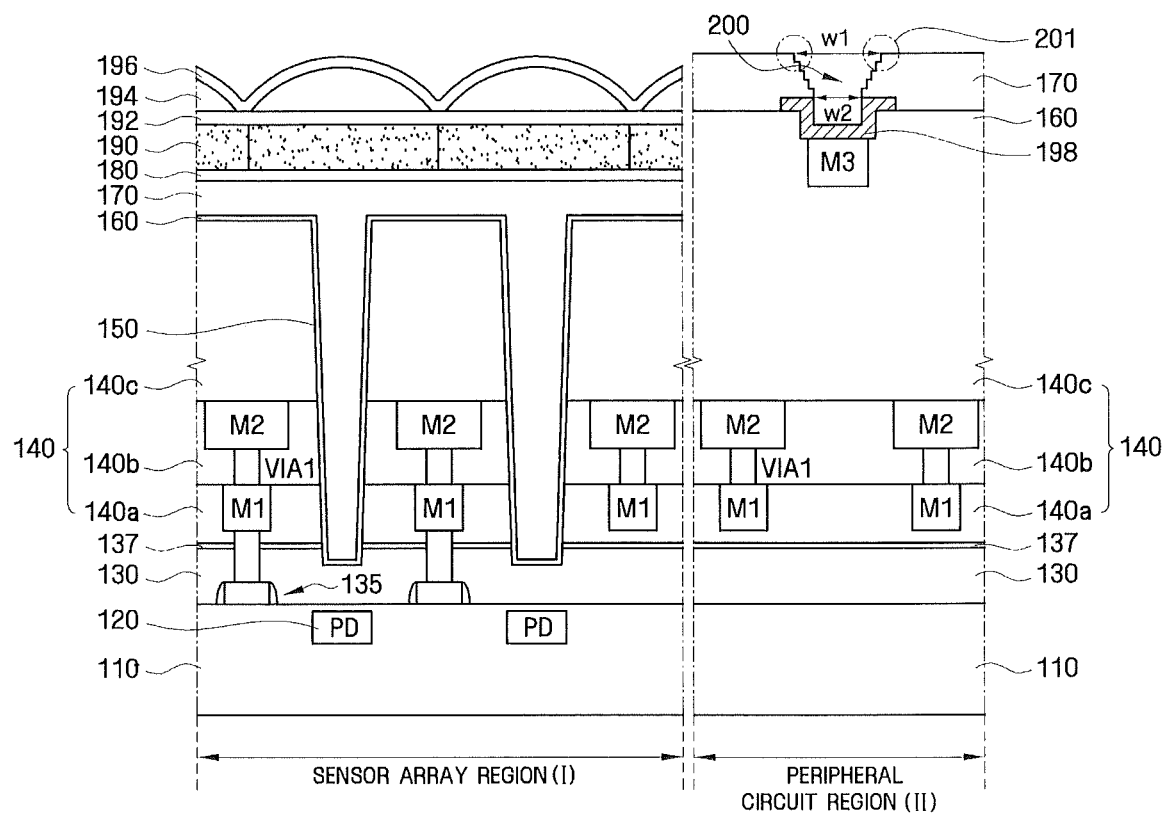
FIG. 8 is a sectional view of the image sensor according to a third embodiment of the present invention, taken along line K-K' of FIG. 3.

Next, with reference to FIG. 8, an image sensor according to a third embodiment of the present invention will be described. FIG. 8 is a sectional view of the image sensor according to a third embodiment of the present invention, taken along line K-K' of FIG. 3. The image sensor according to the third embodiment of the present invention is the same as the image sensor according to the first embodiment of the present invention except for the shape of an opening 200, and thus the duplicate explanation thereof will be omitted.

Referring to FIG. 8, an opening 200 of an image sensor according to the third embodiment of the present invention may have a stepped side profile like stairs. The opening 200 having a side profile in the form of stairs may be formed, for example, using a grayscale mask. In this case, unlike the conductive pad as illustrated in FIG. 8, the conductive pad 198 may be formed in the same manner as the conductive pad 198 of the image sensor according to the second embodiment of the present invention.

Since other particulars of the image sensor according to the third embodiment of the present invention are the same as those of the image sensor according to the first and second embodiments of the present invention, the duplicate explanation thereof will be omitted.

Figure 9:
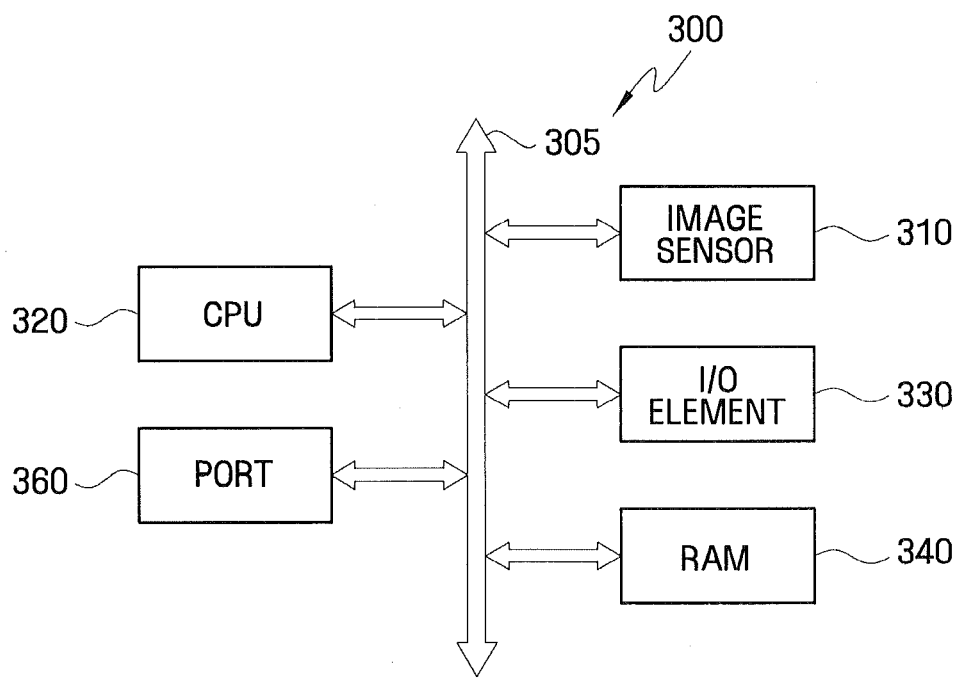
FIG. 9 is a view illustrating a computer device.
Figure 10:
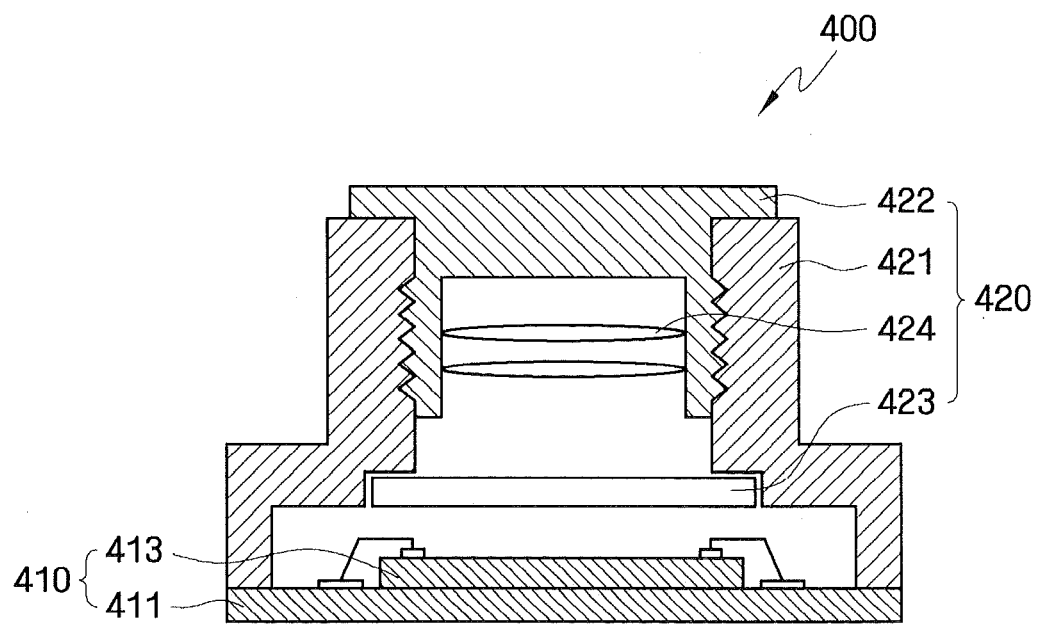
FIGS. 10 and 11 are views illustrating a camera device.
Figure 11:
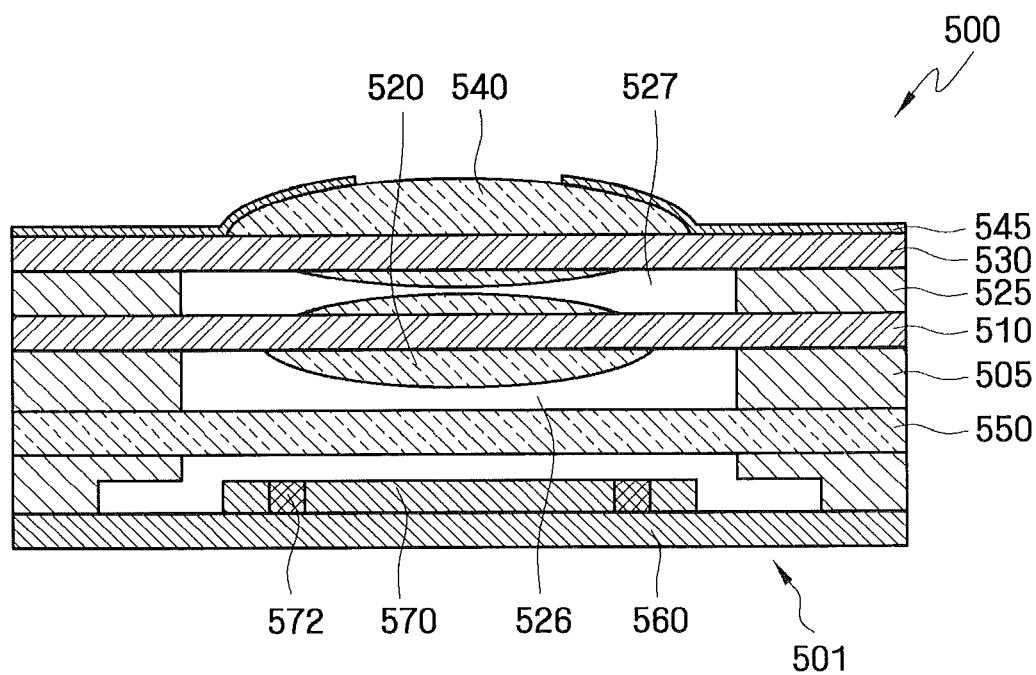
Figure 12:
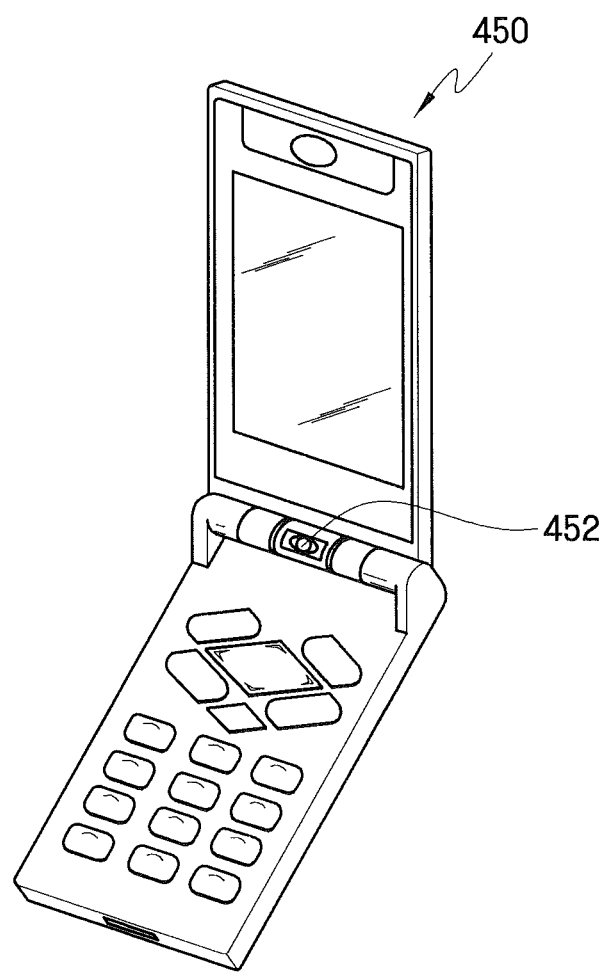
FIG. 12 is a view illustrating a portable phone device.

Next, with reference to FIGS. 9 to 12, a processor-based device that includes an image sensor according to the embodiments of the present invention will be described. FIG. 9 is a view illustrating a computer device, FIGS. 10 and 11 are views illustrating a camera device, and FIG. 12 is a view illustrating a portable phone device. It is apparent that the image sensor according to the embodiments of the present invention can be used in other devices (e.g. a scanner, a machined clock work, a navigation device, a video phone, a monitoring device, an auto focus device, a tracking device, an operation supervisory device, an image stabilizing device, and the like) in addition to the above-described device.

Referring to FIG. 9, a computer device 300 includes a central information processing device (CPU) 320 such as a microprocessor that can communicate with an input/output (I/O) device 330 through a bus 305. An image sensor 310 can communicate with a device through the bus 305 or other communication links. Also, the processor-based device 300 may further include a RAM 340 and/or a port 360 which can communicate with the CPU 320 through the bus 305. The port 360 may be a port which can couple a video card, a sound card, a memory card, a USB device, and the like, or can communicate with other devices. The image sensor 310 may be integrated together with the CPU, a digital signal processor (DSP), a microprocessor, or the like. Also, a memory may be integrated together with the image sensor. Of course, the image sensor may also be integrated into a separate chip together with the processor.

Referring to FIG. 10, a camera device 400 includes an image sensor package 410 in which an image sensor 413 is packaged on a circuit board 411 through a bonding wire. Also, a housing 420 is attached to the circuit board 411 to protect the circuit board 411 and the image sensor 413 from an external environment. An optical tube assembly 421, through which an image to be captured passes, may be formed in the housing. A protection cover 422 may be installed at an outer end portion of the optical tube assembly 421, and an infrared blocking and anti-reflection filter 423 may be mounted at an inner end portion of the optical tube assembly 421. Also, a lens 424 is mounted inside the optical tube assembly 421, and the lens 424 can move along screw thread formed on the optical tube assembly 421.

Referring to FIG. 11, a camera device 500 uses an image sensor package 501 using a through via 572. Using the through via 572, an image sensor 570 and a circuit board 560 can be electrically connected to each other even without using the wire bonding. Here, the unexplained reference numeral "520" denotes a first lens, "540" denotes a second lens, and "526" and "527" denote lens components. Also, "505" denotes a support member, "545" denotes an aperture, "510" and "530" denote transparent substrates, and "550" denotes glass. Referring to FIG. 12, an image sensor 452 is attached at a specified position of a portable phone system 450. Of course, the image sensor 452 may be attached to a position that is different from the position illustrated in FIG. 12.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. An image sensor comprising:
    an interconnection structure formed on a substrate, in which a photoelectric conversion device is formed, and including an inter-metal insulating layer and a metal interconnection arranged in the inter-metal insulating layer;
    a cavity formed in the interconnection structure corresponding to the photoelectric conversion device;
    a conductive pad formed on the interconnection structure and connected to the metal interconnection; and
    a light guide part, wherein the light guide part is formed in the cavity and on the interconnection structure and the conductive pad and includes an opening extending in a peripheral circuit region and having a tapered side profile on the conductive pad.

2. The image sensor of claim 1, wherein an upper width of the opening is larger than a lower width of the opening.

3. The image sensor of claim 2, wherein the tapered side profile of the opening is stepped like stairs.

4. The image sensor of claim 1, wherein an index of refraction of the light guide part is greater than an index of refraction of the inter-metal insulating layer.

5. The image sensor of claim 1, wherein the light guide part contacts an upper surface of the conductive pad.

6. The image sensor of claim 1, wherein an area of an upper surface of the opening is larger than an area of a lower surface of the opening and the upper surface of the opening is in the shape of an octagon.

7. The image sensor of claim 1, wherein a taper angle of the opening is 50 to 70 degrees.

8. The image sensor of claim 1, wherein the conductive pad has a tapered side profile.

9. The image sensor of claim 1, further comprising an anti-moisture-absorption layer formed on the interconnection structure and conformally formed on an inner surface of the cavity, wherein the conductive pad is between the anti-moisture-absorption layer and the light guide part.

10. The image sensor of claim 9, wherein a portion of the conductive pad is in the anti-moisture-absorption layer.

11. An image sensor comprising:
    an interconnection structure formed on a substrate, in which a photoelectric conversion device is formed, and including an inter-metal insulating layer and a metal interconnection arranged in the inter-metal insulating layer;
    a cavity formed in the interconnection structure corresponding to the photoelectric conversion device; and
    a light guide part formed on the interconnection structure and the cavity, the light guide part including a planarization region, a slope region, and an exposure region for exposing a conductive pad and contacting an upper surface of the conductive pad,
    wherein an area formed by a first boundary that is defined as a boundary between the planarization region and the slope region is larger than an area formed by a second boundary that is defined as a boundary between the slope region and the exposure region.

12. The image sensor of claim 11, wherein the first boundary and the second boundary have the same shape.

13. The image sensor of claim 12, wherein the first boundary and the second boundary are in the shape of an octagon.

14. The image sensor of claim 11, wherein an index of refraction of the light guide part is greater than an index of refraction of the inter-metal insulating layer.

15. The image sensor of claim 11, further comprising an anti-moisture-absorption layer formed on the interconnection structure and conformally formed on an inner surface of the cavity, wherein the conductive pad is between the anti-moisture-absorption layer and the light guide part.

16. The image sensor of claim 11, wherein the width of the slope region is 1 to 5 µm.

17. An image sensor comprising:
    a photoelectric conversion device in a substrate;
    an interconnection structure on the substrate, the interconnection structure including an inter-metal insulating layer and a plurality of metal interconnections in the inter-metal insulating layer;
    a cavity in the interconnection structure corresponding to the photoelectric conversion device;
    a conductive pad on the interconnection structure, the conductive pad being connected to one of the plurality of metal interconnections;
    a light guide layer on the interconnection structure and the conductive pad, the light guide layer filling the cavity, contacting an upper surface of the conductive pad and including an opening exposing a portion of the conductive pad; and
    an anti-moisture-absorption layer on the interconnection structure and between an inner surface of the cavity and a portion of the light guide layer in the cavity,
    wherein the conductive pad is between the anti-moisture-absorption layer and the light guide layer.

18. The image sensor of claim 17, wherein an index of refraction of the light guide layer is greater than an index of refraction of the inter-metal insulating layer.

19. The image sensor of claim 18, wherein the opening of the light guide layer has a tapered side profile.

20. The image sensor of claim 18, wherein the light guide layer comprises a material selected from a group consisting of a fluoro series polymer, a poly-siloxane resin, titanium oxide and a polymethyl methacrylate (PMMA) series polymer.

* * * * *